United States Patent [19]

Hallford

[11] 4,375,700
[45] Mar. 1, 1983

[54] LOW FREQUENCY CONVERTER WITH ISOLATED MIXER SECTIONS

[75] Inventor: Ben R. Hallford, Wylie, Tex.

[73] Assignee: Rockwell International Corporation, El Segundo, Calif.

[21] Appl. No.: 286,413

[22] Filed: Jul. 24, 1981

[51] Int. Cl.³ .............................................. H04B 1/26
[52] U.S. Cl. ................................... 455/330; 455/332; 332/43 B
[58] Field of Search ............... 455/323, 326, 330, 332, 455/333; 332/24, 43 B

[56] References Cited

U.S. PATENT DOCUMENTS

| | | | |
|---|---|---|---|
| 2,377,858 | 6/1945 | Bennett | 332/43 B |
| 2,455,732 | 12/1948 | Carter | 332/43 B |
| 2,545,250 | 3/1951 | Appert | 332/43 B |
| 2,820,949 | 1/1958 | Hey | 332/43 B |
| 3,390,343 | 6/1968 | Carter | 332/43 B |

*Primary Examiner*—Jin F. Ng
*Attorney, Agent, or Firm*—Michael E. Taken; Bruce C. Lutz; Howard R. Greenberg

[57] ABSTRACT

A low frequency diode mixer is provided in combination with simple, compact transformer circuitry. A four diode mixer interconnects three dual transformers. The mixer has a pair of separate, isolated two diode sections commonly servicing the first transformer and separately servicing the other two transformers.

5 Claims, 1 Drawing Figure

LOW FREQUENCY CONVERTER WITH ISOLATED MIXER SECTIONS

TECHNICAL FIELD

The invention relates to low frequency diode mixers and associated circuitry for up or down conversion between transformer coupled signals.

BACKGROUND AND SUMMARY

Frequency converters using diode mixers are well known in the art. The mixer performs up or down conversion between different frequency input signals. The frequencies which are output from the mixer are the modulation products which exist according to the heterodyne principle by which the mixer operates, wherein a pair of signals are applied to a nonlinear element such as a diode.

The present invention relates to low frequency diode mixers wherein the signal frequencies are low enough to permit coupling through transformer windings. Transformers are inherently bulky and costly to implement. The present invention evolved from efforts to provide simple, compact and low cost transformer circuitry in combination with a diode mixer.

The invention also evolved from efforts to improve isolation between the signals in the mixer. Separate mixer sections are provided to improve conversion efficiency and to minimize degrading influences, undesired coupling, parasitic induction, and the like, otherwise introducing distortion and other adverse performance characteristics.

DETAILED DESCRIPTION

Figure 1:
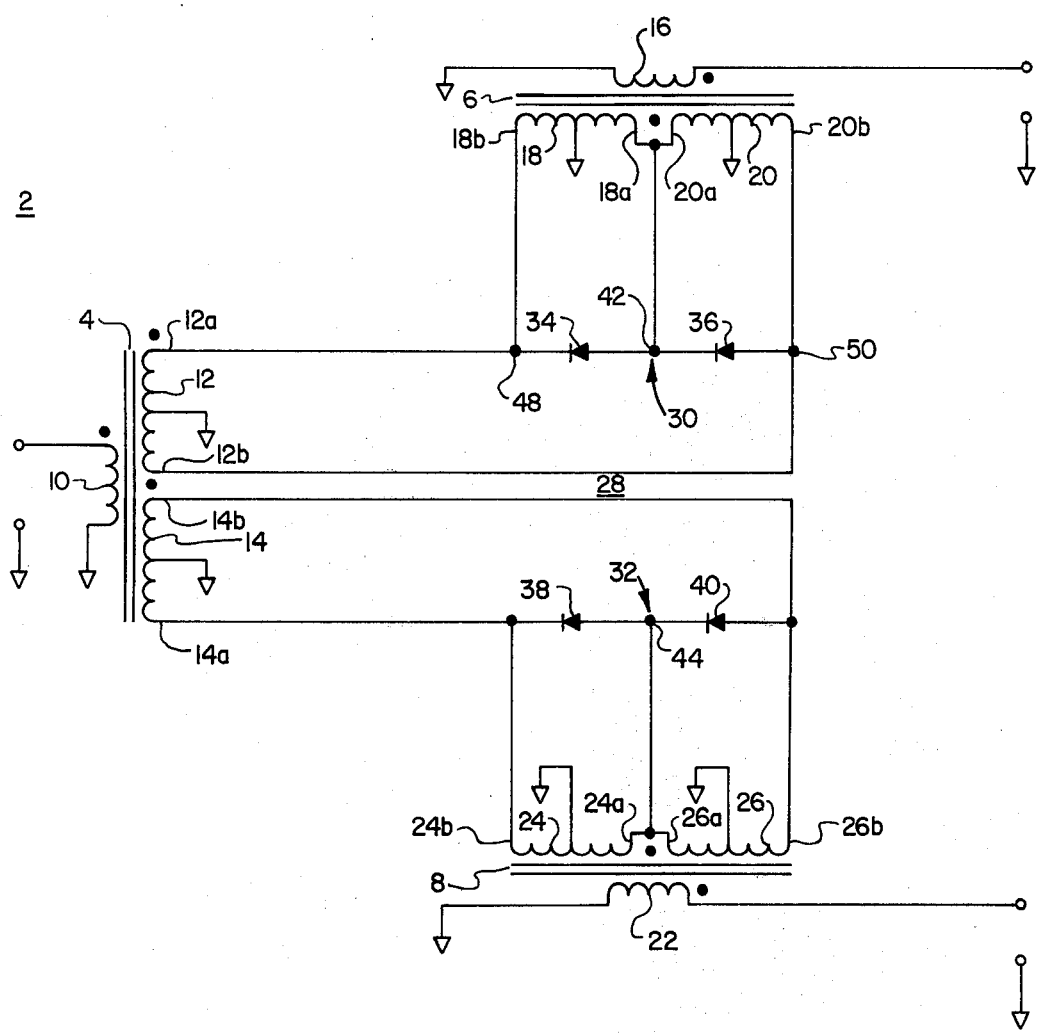
FIG. 1 is a schematic circuit diagram of a low frequency diode mixer frequency converter constructed in accordance with the invention.

Frequency converter 2 has first, second and third dual transformers 4, 6, and 8, respectively. First dual transformer 4 has a primary winding 10 and a pair of secondary windings 12 and 14; second dual transformer 6 has a primary winding 16 and a pair of secondary windings 18 and 20; and third dual transformer 8 has a primary winding 22 and a pair of secondary windings 24 and 26. A four diode mixer 28 interconnects the noted secondary windings for heterodyne modulation product signal generation.

Four diode mixer 28 comprises a pair of isolated sections 30 and 32. First section 30 comprises a pair of diodes 34 and 36 interconnecting the first secondary winding 12 of the first transformer 10 and the secondary windings 18 and 20 of the second transformer 6. The second section 32 comprises a second pair of diodes 38 and 40 interconnecting the second secondary winding 14 of the first transformer 10 and the secondary windings 24 and 26 of the third transformer 8.

Diodes 34 and 36 are commonly poled and connected in series across secondary winding 12. Diodes 38 and 40 are commonly poled and connected in series across secondary winding 14. One end 18a of the first secondary winding 18 of the second dual transformer 6 and one end 20a of the second secondary winding 20 of the second dual transformer 6 are connected in common to a point 42 between diodes 34 and 36. One end 24a of the first secondary winding 24 of the third dual transformer 8 and one end 26a of the second secondary winding 26 of the third dual transformer 8 are connected in common to a point 44 between diodes 38 and 40.

The other end 18b of the first secondary winding 18 of the second transformer 6 is connected to one end 12a of the first secondary winding 12 of the first dual transformer 4. The other end 20b of the second secondary winding 20 of the second dual transformer 6 is connected to the other end 12b of the first secondary winding 12 of the first dual transformer 4. The other end 24b of the first secondary winding 24 of the third dual transformer 8 is connected to one end 14a of the second secondary winding 14 of the first dual transformer 4. The other end 26b of the second secondary winding 26 of the third dual transformer 8 is connected to the other end 14b of the second secondary winding 14 of the first dual transformer 4.

The same polarity said one ends 18a and 20a of the secondary windings of the second transformer 6 are connected to point 42. Other end 18b of the first secondary winding 18 of transformer 6 is connected to the opposite polarity end 12a of the first secondary winding 12 of transformer 4. Other end 20b of secondary winding 20 is connected to the same polarity end 12b of secondary winding 12.

The same polarity said one ends 24a and 26a of the secondary windings 24 and 26 of the third dual transformer 8 are connected to point 44. Other end 24b of the first secondary winding 24 of transformer 8 is connected to the same polarity end 14a of the second secondary winding 14 of the first transformer 4. Other end 26b of winding 26 is connected to the same polarity end 14b of winding 14.

When converter 2 is implemented as a down converter, a signal of frequency f1 is input at 10, and frequency f2 quadrature signals are input at 16 and 22. The diode pairs mix the f1 and f2 signals to generate a signal having a frequency f3 which is the difference between f1 and f2. The f3 signal is coupled through transformer 6 and through transformer 8 and induced on leads 16 and 22, with windings 18 and 20, and 24 and 26, acting as primaries and windings 16 and 22 acting as secondaries for the f3 signal. The f3 signal may alternatively be directly removed by tap-off connections from points 42 and 44. For example, the f3 signal from point 42 is referenced to an f3 ground which is a common connection of points 48 and 50 (not shown). The f3 signal directly derived from point 44 is comparably referenced.

When converter 2 is implemented as an up converter, f2 and f3 signals are input at 16 and 22. The diodes mix the signals, resulting in heterodyne modulation product signal generation by the mixer, including an f1 signal in windings 12 and 14 and hence an induced output f1 signal in winding 10.

Mutual isolation is provided between the various signals. Signals from input port 16 are isolated from port 22 by separation of the mixer sections 30 and 32, and vice versa.

The f1 signal in transformer 4 is isolated from the f2 signals in transformers 6 and 8. The f2 signal coupled through transformer 6 to end leads 18a and 20a and to point 42 sees the same effective potential drop across each of diodes 34 and 36 because respective diode connections points 48 and 50 are at substantially the same potential reference level relative to f2 signals because of their connection to the other ends 18b and 20b of windings 18 and 20. Thus, no net potential is induced between leads 12a and 12b from the f2 signals on point 42, i.e., an f2 signal on point 42 sees the same potential drop to each of leads 12a and 12b and thus does not induce any new or additional net potential therebetween. The f1 signal in transformer 4 is thus isolated from the f2 signal in transformer 6. The f1 signal in transformer 4 is likewise isolated from the f2 signal in transformer 8.

The f2 signal in transformer 6 is isolated from the f1 signal in transformer 4. The f1 signal from lead 12b and connection point 50 flows through diode 36 and then through diode 34 to connection point 48 and to lead 12a. Leads 12b and 12a are each other's reference points, and hence the voltage on connection point 50 is referenced to connection point 48 and lead 12a, not lead 18b. The f1 signal from connection point 50 flows through diode 36 toward point 42, and then through diode 34 away from point 42, such that leads 18a and 20a and point 42 see opposite polarities (voltages which are 180° out of phase), and hence no new or additional net voltage is induced on point 42 and windings 18 and 20 by f1 signals. The f2 signal in transformer 8 is likewise isolated from the f1 signal in transformer 4.

It is recognized that various modifications are possible within the scope of the appended claims.

It is claimed:

1. A frequency converter comprising, in combination:
   first, second and third dual transformers, each having a primary winding and a pair of secondary windings; and
   a four diode mixer, comprising a first and second isolated two diode sections, interconnecting said secondary windings for heterodyne modulation product signal generation, the first diode section comprises a first pair of diodes interconnecting the first secondary winding of said first transformer and the secondary windings of said second transformer, and the second diode section comprises a second pair of diodes interconnecting the secondary winding of said first transformer and the secondary windings of said third transformer.

2. The invention according to claim 1 wherein said first pair of diodes are connected in series across said first secondary winding of said first transformer, and said second pair of diodes are connected in series across said second secondary winding of said first transformer.

3. The invention according to claim 2 wherein:
   one end of the first secondary winding of said second transformer and one end of the second secondary winding of said second transformer are connected in common to a point between said first pair of diodes; and
   one end of the first secondary winding of said third transformer and one end of the second secondary winding of said third transformer are connected in common to a point between said second pair of diodes.

4. The invention according to claim 3 wherein:
   the other end of said first secondary winding of said second transformer is connected to one end of said first secondary winding of said first transformer;
   the other end of said second secondary winding of said second transformer is connected to the other end of said first secondary winding of said first transformer;
   the other end of said first secondary winding of said third transformer is connected to one end of said second secondary winding of said first transformer; and
   the other end of said second secondary winding of said third transformer is connected to the other end of said second secondary winding of said first transformer.

5. The invention according to claim 4 wherein:
   said one ends of said first and second secondary windings of said second transformer having the same polarity are connected to said point between said first pair of diodes;
   said other end of said first secondary winding of said second transformer is connected to the opposite polarity end of said first secondary winding of said first transformer;
   said other end of said second secondary winding of said second transformer is connected to the same polarity end of said first secondary winding of said first transformer;
   said one ends of said first and second secondary windings of said third transformer having the same polarity are connected to said point between said second pair of diodes;
   said other end of said first secondary winding of said third transformer is connected to the same polarity end of said second secondary winding of said first transformer; and
   said other end of said second secondary winding of said third transformer is connected to the opposite polarity end of said second secondary winding of said first transformer.

* * * * *